(12) United States Patent
Kiso et al.

(10) Patent No.: US 11,171,080 B2
(45) Date of Patent: Nov. 9, 2021

(54) WIRING SUBSTRATE

(71) Applicant: SHINKO ELECTRIC INDUSTRIES CO., LTD., Nagano (JP)

(72) Inventors: Takahiko Kiso, Nagano (JP); Masahiro Kyozuka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/654,733

(22) Filed: Oct. 16, 2019

(65) Prior Publication Data
US 2020/0126897 A1    Apr. 23, 2020

(30) Foreign Application Priority Data
Oct. 22, 2018 (JP) .............................. JP2018-198670

(51) Int. Cl.
| | |
|---|---|
| *H01L 23/498* | (2006.01) |
| *H01L 23/13* | (2006.01) |
| *H01L 23/31* | (2006.01) |
| *H01L 23/367* | (2006.01) |
| *H01L 23/29* | (2006.01) |
| *H01L 21/48* | (2006.01) |

(Continued)

(52) U.S. Cl.
CPC ...... *H01L 23/49822* (2013.01); *H01L 21/486* (2013.01); *H01L 21/4857* (2013.01); *H01L 21/565* (2013.01); *H01L 23/13* (2013.01); *H01L 23/295* (2013.01); *H01L 23/3128* (2013.01); *H01L 23/3135* (2013.01); *H01L 23/3675* (2013.01); *H01L 23/3737* (2013.01); *H01L 23/49827* (2013.01); *H01L 23/49838* (2013.01); *H01L 23/49894* (2013.01); *H01L 23/5389* (2013.01); *H01L 23/49816* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | | |
|---|---|---|---|---|
| 2006/0204733 | A1* | 9/2006 | Murai | ............... H01L 23/49894 |
| | | | | 428/209 |
| 2007/0044303 | A1* | 3/2007 | Yamano | ............. H01L 23/5389 |
| | | | | 29/830 |

(Continued)

FOREIGN PATENT DOCUMENTS

| | | |
|---|---|---|
| JP | 2007-59821 | 3/2007 |
| JP | 2017-117842 | 6/2017 |

*Primary Examiner* — Steven B Gauthier
(74) *Attorney, Agent, or Firm* — Rankin, Hill & Clark LLP (57) ABSTRACT

A wiring substrate includes a first insulation layer, an electronic component including a first surface and a second surface which is an opposite surface to the first surface, the electronic component being mounted on the first insulation layer with the first surface facing toward the first insulation layer, and a second insulation layer including a first layer and a second layer. The first layer is formed on the first insulation layer and configured to cover the second surface of the electronic component, and the second layer is stacked on the first layer. The first layer includes therein fillers. At least one of the fillers is in direct contact with the second surface of the electronic component at one side, and is exposed from the first layer and is thus in direct contact with the second layer at the other side.

8 Claims, 6 Drawing Sheets

(51) Int. Cl.
  *H01L 21/56*   (2006.01)
  *H01L 23/373*  (2006.01)
  *H01L 23/538*  (2006.01)
  *H01L 23/00*   (2006.01)

(56) References Cited

U.S. PATENT DOCUMENTS

2012/0187557 A1\* 7/2012 Kyozuka ................. H01L 24/19
  257/734
2018/0061767 A1\* 3/2018 Chiang ............... H01L 23/5383

\* cited by examiner

WIRING SUBSTRATE

CROSS-REFERENCE TO RELATED APPLICATIONS

This application is based upon and claims the benefit of priority from prior Japanese patent application No. 2018-198670, filed on Oct. 22, 2018, the entire contents of which are incorporated herein by reference.

TECHNICAL FIELD

The present disclosure relates to a wiring substrate.

BACKGROUND ART

In the related art, known is a wiring substrate in which an electronic component such as a semiconductor chip, from which heat is generated, is embedded. In the wiring substrate, the electronic component is covered with a plurality of insulation layers, for example. Specifically, a wiring substrate in which the electronic component is covered with two insulation layers and lower an upper layers configuring the two insulation layers are resin layers having fillers contained therein may be exemplified.

[PTL 1] JP-A-2007-59821
[PTL 2] JP-A-2017-117842

However, since the electronic component generates heat, it is concerned that heat conductivity will be lowered when an interface between a plurality of insulation layers exists just above the electronic component. Since both the two insulation layers contain the fillers, it is expected that the lowering in heat conductivity will be suppressed. Also in this case, however, since the heat generated from the electronic component is transferred to the resin part, too, it is not possible to sufficiently suppress the lowering in heat conductivity.

SUMMARY OF INVENTION

Aspect of non-limiting embodiments of the present disclosure is to provide a wiring substrate having an electronic component, which can suppress lowering in heat conductivity.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

A wiring substrate according to the present disclosure comprises:
a first insulation layer;
an electronic component including a first surface and a second surface which is an opposite surface to the first surface, the electronic component being mounted on the first insulation layer with the first surface facing toward the first insulation layer; and
a second insulation layer including a first layer and a second layer,
wherein the first layer is formed on the first insulation layer and configured to cover the second surface of the electronic component, and the second layer is stacked on the first layer,
wherein the first layer includes therein fillers, and
wherein at least one of the fillers is in direct contact with the second surface of the electronic component at one side, and is exposed from the first layer and is thus in direct contact with the second layer at the other side.

According to the present disclosure, it is possible to suppress lowering in heat conductivity in the wiring substrate having the electronic component.

DETAILED DESCRIPTION OF EMBODIMENTS

Hereinafter, embodiments of the present disclosure will be described with reference to the drawings. Meanwhile, in the respective drawings, the same constitutional parts are denoted with the same reference numerals, and the overlapping descriptions thereof may be omitted.

The wiring substrate of the present disclosure is an electronic component-embedded wiring substrate in which an electronic component is embedded, and is particularly effective when an electronic component, from which a large amount of heat is generated, is embedded. As the electronic component from which a large amount of heat is generated, a semiconductor chip may be exemplified. As the electronic component from which a large amount of heat is generated, a resistor and a chip capacitor may be exemplified. Hereinbelow, the semiconductor chip is exemplified as the electronic component.

[Structure of Wiring Substrate of Exemplary Embodiment]

Figure 1A:
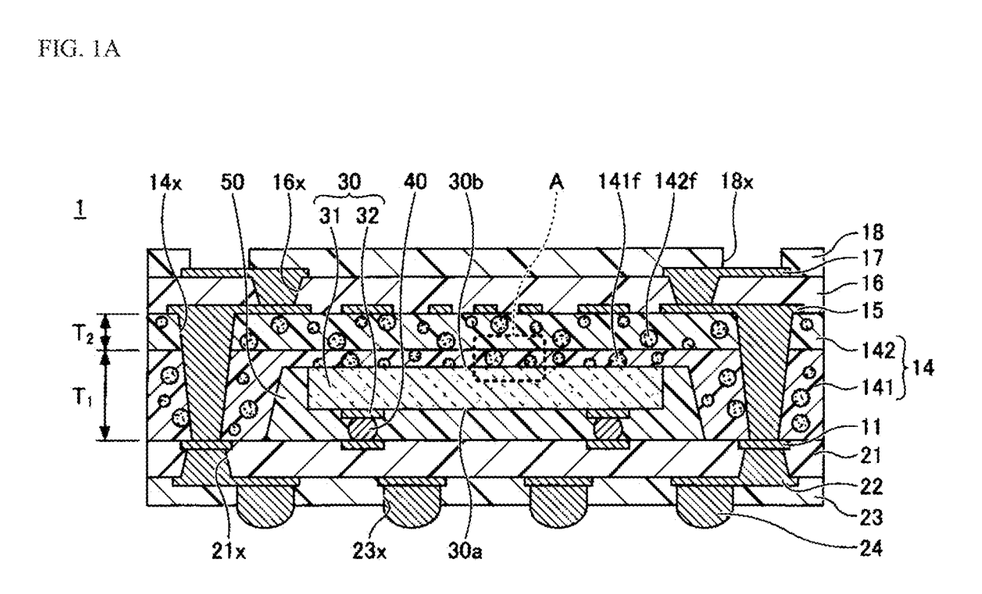
FIGS. 1A and 1B are views illustrating a wiring substrate in accordance with an exemplary embodiment.
Figure 1B:
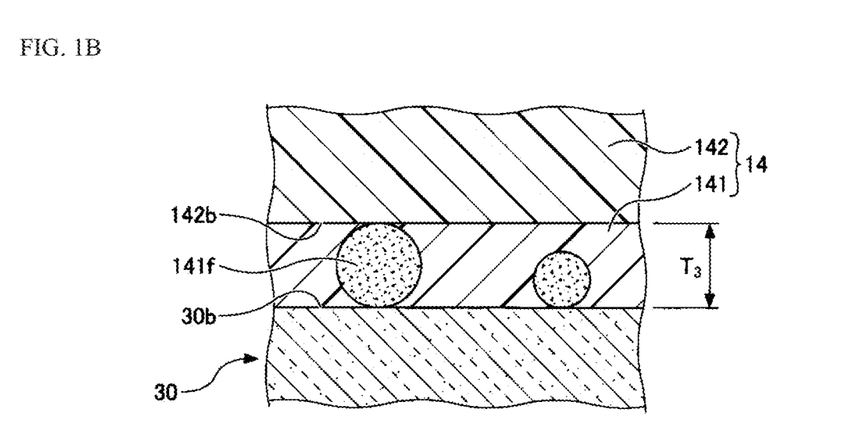

First, a structure of a wiring substrate of an exemplary embodiment is described. FIGS. 1A and 1B are views illustrating the wiring substrate in accordance with the exemplary embodiment, in which FIG. 1A is a sectional view and FIG. 1B is an enlarged view of an A part of FIG. 1A.

Referring to FIG. 1A, a wiring substrate 1 is a chip-embedded wiring substrate in which a semiconductor chip 30 is embedded. The wiring substrate 1 includes a wiring layer 11, an insulation layer 14, a wiring layer 15, an insulation layer 16, a wiring layer 17, a solder resist layer 18, an insulation layer 21, a wiring layer 22, a solder resist layer 23, external connection terminals 24, a semiconductor chip 30, bumps 40, and an under-fill resin 50.

Meanwhile, in the exemplary embodiment, for convenience sake, the solder resist layer 18-side of the wiring substrate 1 is referred to as 'upper side' or 'one side', and the solder resist layer 23-side is referred to as 'lower side' or 'other side'. Also, a surface of each part facing toward the solder resist layer 18 is referred to as 'one surface' or 'upper surface', and a surface facing toward the solder resist layer 23 is referred to as 'other surface' or 'lower surface'. However, the wiring substrate 1 can be used with being vertically reversed and can be arranged at any angle. Also, the description 'as seen from above' indicates that a target object is seen in a normal direction of one surface of the solder resist layer 18, and a planar shape indicates a shape of the target object as seen from the normal direction of one surface of the solder resist layer 18.

In the wiring substrate 1, the wiring layer 11 is embedded in the upper surface of the insulation layer 21. The wiring layer 11 is patterned into a predetermined planar shape. The upper surface of the wiring layer 11 and the upper surface of the insulation layer 21 may be formed to be flush with each other, for example. As a material of the wiring layer 11, for example, copper (Cu) or the like may be used. A thickness of the wiring layer 11 may be set to about 10 μm to 30 μm, for example. In the meantime, the wiring layer 11 may have pads for chip connection, via-receiving pads, a wiring pattern and the like, as appropriate.

The semiconductor chip 30 is flip chip-mounted on the insulation layer 21 in a state in which a circuit formation surface 30a (first surface) faces toward the insulation layer 21 (a face down state). The semiconductor chip 30 has a structure that a semiconductor integrated circuit (not shown) and the like are formed on a thinned semiconductor substrate 31 made of silicon, for example. On the circuit formation surface 30a, electrode pads 32 electrically connected to the semiconductor integrated circuit are formed.

The electrode pads 32 of the semiconductor chip 30 are electrically connected to the pads for chip connection of the wiring layer 11, via the bumps 40. The under-fill resin 50 is filled between the circuit formation surface 30a of the semiconductor chip 30 and the upper surface of the insulation layer 21, covers side surfaces of the semiconductor chip 30, and exposes a rear surface 30b (second surface) of the semiconductor chip 30. The bumps 40 are, for example, solder bumps. As a material of the solder bump, for example, SnBi solder or the like may be used.

Although functions of the semiconductor chip 30 are not particularly limited, a memory (DRAM and the like), a logic (CPU and the like), an application processor and the like may be exemplified. The wiring substrate 1 may be mounted thereon with a plurality of the semiconductor chips 30 having the same or different functions.

The insulation layer 14 is formed on the upper surface of the insulation layer 21. In a case that the insulation layer 14 has one-layered structure, if the insulation layer 14 is thickened, when the semiconductor chip 30 is embedded, variation in thickness of the insulation layer 14 is partially generated, so that it is difficult to directly form a high-density wiring layer on the insulation layer 14. Therefore, in the wiring substrate 1, the insulation layer 14 is formed to have a two-layered structure including a relatively thick first layer 141 in which the semiconductor chip 30 is embedded, and a second layer 142 thinner than the first layer 141, so that variation in thickness caused in the first layer 141 is absorbed by the second layer 142. Thereby, since smoothness of an upper surface of the second layer 142 is improved, it is possible to form the high-density wiring layer 15 on the upper surface of the second layer 142.

In the meantime, in the present disclosure, the high-density wiring layer indicates a wiring layer having a line/space equal to or smaller than 30 μm/30 μm. Here, the line of the line/space indicates a wiring width, and the space indicates an interval between the adjacent wirings (wiring interval). For example, the line/space of 2 μm/2 μm indicates that the wiring width is 2 μm and the interval between the adjacent wirings is 2 μm.

The first layer 141 is formed on the insulation layer 21 and covers a part of the wiring layer 11, the rear surface 30b of the semiconductor chip 30, and the under-fill resin 50. The second layer 142 is stacked on the first layer 141. As the first layer 141 and the second layer 142, for example, an insulating resin such as an epoxy-based resin may be used. Also, as the first layer 141 and the second layer 142, different insulating resins may be used. A thickness $T_1$ of the first layer 141 may be set to about 120 μm to 140 μm, for example. A thickness $T_2$ of the second layer 142 may be set to about 20 μm to 40 μm, for example. A roughness degree of the upper surface of the second layer 142 is smaller than a roughness degree of the upper surface of the first layer 141. A line/space of the wiring layer 15 may be set to about 30 μm/30 μm, for example.

Also, in the wiring substrate 1, lowering in heat dissipation characteristic (lowering in heat conductivity due to an interface between the insulation layers just above the semiconductor chip 30), which may be caused due to the two-layered structure of the insulation layer 14, is suppressed. This is hereinbelow described.

The first layer 141 contains fillers 141f, and the second layer 142 contains fillers 142f. As the fillers 141f, 142f, silica ($SiO_2$), kaolin ($Al_2Si_2O_5$ ($OH_4$)), alumina ($Al_2O_3$) and the like may be exemplified. Also, they may be mixed. The fillers 141f, 142f may have an average particle size of about 0.5 μm and a maximum particle size of about 5 μm, respectively, for example. The type, particle size and content of the filler 141f may be the same as or different from the type, particle size and content of the filler 142f.

A thickness $T_3$ of the first layer 141 of the part covering the rear surface 30b of the semiconductor chip 30 is designed to be substantially the same as the maximum particle size of the filler 141f. In the part of the first layer 141 covering the rear surface 30b of the semiconductor chip 30, a plurality of the fillers 141f is randomly arranged. For this reason, as shown in FIG. 1B, at least one of the fillers 141f included in the first layer 141 is in direct contact with the rear surface 30b of the semiconductor chip 30 at one side, and the other side thereof is exposed from the upper surface of the first layer 141 and is thus in direct contact with the lower surface 142b of the second layer 142. In the meantime, at least one of the fillers 141f included in the first layer 141 may be in direct contact with the rear surface 30b of the semiconductor chip 30 at one side and the other side thereof may protrude from the upper surface of the first layer 141 and may be thus in direct contact with the second layer 142.

In this way, at least one of the fillers 141f included in the first layer 141 is in direct contact with the rear surface 30b of the semiconductor chip 30 and the second layer 142, so that it is possible to improve a heat dissipation characteristic of the wiring substrate 1, as described later.

For example, when the filler 141f is formed of silica, the heat conductivity thereof is about 1.3 to 10 W/m·k. In contrast, when the resin forming the first layer 141 is an epoxy-based resin, the heat conductivity thereof is about 0.3 W/m·k. The filler 141f in direct contact with the rear surface 30b of the semiconductor chip 30 and the second layer 142 is present, so that heat generated from the semiconductor chip 30 is transferred through the filler 141f having higher heat conductivity than the resin configuring the first layer 141. For this reason, it is possible to effectively move the heat from the semiconductor chip 30 to the second layer 142, so that it is possible to improve the heat dissipation characteristic of the wiring substrate 1.

The second layer 142 preferably has higher heat conductivity than the first layer 141. Thereby, it is possible to further improve the heat dissipation characteristic of the wiring substrate 1. In order to make the second layer 142 have higher heat conductivity than the first layer 141, for example, the fillers 141*f*, 142*f* are formed of the same material, and the content of the filler 142*f* is made to be larger than the content of the filler 141*f*. Also, as the filler 142*f*, a filler having higher heat conductivity than the first layer 141 may be selected. Also, as the resin configuring the second layer 142, a resin having higher heat conductivity than the resin configuring the first layer 141 may be selected. Alternatively, these may be appropriately combined.

In the meantime, some of the fillers 141*f* included in the first layer 141 are expelled from a region of the first layer 141 overlapping the rear surface 30*b* of the semiconductor chip 30, as seen from above, to a region of the first layer 141 located around the semiconductor chip 30, as seen from above, when the first layer 141 is pressurized during a process of forming the first layer 141. Thereby, the fillers 141*f* are eccentrically located in a region closer to the second layer 142 (an upper region of a $T_1/2$ position of the first layer 141) than a position of a half thickness of the first layer 141, in the region of the first layer 141 located around the semiconductor chip 30, as seen from above. That is, in the region of the first layer 141 located around the semiconductor chip 30, as seen from above, a content of the fillers 141*f* in the region closer to the second layer 142 than the position of the half thickness of the first layer 141 is larger than a content of the fillers 141*f* in a region closer to the insulation layer 21 than the position of the half thickness of the first layer 141. As a result, it is possible to effectively transfer laterally the heat generated from the rear surface 30*b* of the semiconductor chip 30 by the fillers 141*f*.

The wiring layer 15 is formed on one side of the insulation layer 14. The wiring layer 15 includes via-wirings filled in via-holes 14*x* penetrating the insulation layer 14 (the first layer 141 and the second layer 142) and exposing the upper surface of the wiring layer 11, and a wiring pattern formed on the upper surface of the insulation layer 14. The wiring layer 15 is electrically connected to the wiring layer 11. The via-hole 14*x* may be formed to have an inverted truncated cone-shaped concave portion of which a diameter of an opening opened toward the insulation layer 16 is larger than a diameter of a bottom surface of an opening formed by the upper surface of the wiring layer 11. A material of the wiring layer 15 and a thickness of the wiring pattern of the wiring layer 15 may be configured in the same manner as the wiring layer 11, for example.

The insulation layer 16 is formed on the upper surface of the insulation layer 14 (the upper surface of the second layer 142). As a material of the insulation layer 16, for example, an insulating resin such as an epoxy-based resin may be used. A thickness of the insulation layer 16 may be set to about 30 μm to 40 μm, for example. The insulation layer 16 may include fillers such as silica ($SiO_2$).

The wiring layer 17 is formed on one side of the insulation layer 16. The wiring layer 17 includes via-wirings filled in via-holes 16*x* penetrating the insulation layer 16 and exposing the upper surface of the wiring layer 15, and a wiring pattern formed on the upper surface of the insulation layer 16. The wiring layer 17 is electrically connected to the wiring layer 15. The via-hole 16*x* may be formed to have an inverted truncated cone-shaped concave portion of which a diameter of an opening opened toward the solder resist layer 18 is larger than a diameter of a bottom surface of an opening formed by the upper surface of the wiring layer 15. A material of the wiring layer 17 and a thickness of the wiring pattern of the wiring layer 17 may be configured in the same manner as the wiring layer 11, for example.

The solder resist layer 18 is an outermost layer of one side of the wiring substrate 1, and is formed on the upper surface of the insulation layer 16 so as to cover the wiring layer 17. The solder resist layer 18 may be formed of a photosensitive resin such as an epoxy-based resin and an acryl-based resin, for example. A thickness of the solder resist layer 18 may be set to about 15 μm to 35 μm, for example.

The solder resist layer 18 has openings 18*x*, and portions of an upper surface of the wiring layer 17 are exposed to bottom portions of the openings 18*x*. A planar shape of the opening 18*x* may be circular, for example. If necessary, the upper surface of the wiring layer 17 exposed into the openings 18*x* may be formed with a metal layer or may be subjected to an antioxidant treatment such as an OSP (Organic Solderability Preservative) treatment. As the metal layer, an Au layer, a Ni/Au layer (a metal layer having a Ni layer and an Au stacked in corresponding order), a Ni/Pd/Au layer (a metal layer having a Ni layer, a Pd layer and an Au layer stacked in corresponding order), and the like may be exemplified. The upper surface of the wiring layer 17 exposed to the bottom portions of the openings 18*x* may be formed with external connection terminals such as solder bumps.

The insulation layer 21 is formed on a lower surface of the insulation layer 14. As a material of the insulation layer 21, for example, an insulating resin such as an epoxy-based resin may be used. A thickness of the insulation layer 21 may be set to about 30 μm to 40 μm, for example. The insulation layer 21 may include fillers such as silica ($SiO_2$).

The wiring layer 22 is formed on the other side of the insulation layer 21. The wiring layer 22 includes via-wirings filled in via-holes 21*x* penetrating the insulation layer 21 and exposing the lower surface of the wiring layer 11, and a wiring pattern formed on the lower surface of the insulation layer 21. The wiring layer 22 is electrically connected to the wiring layer 11. The via-hole 21*x* may be formed to have a truncated cone-shaped concave portion of which a diameter of an opening opened toward the solder resist layer 23 is larger than a diameter of a bottom surface of an opening formed by the lower surface of the wiring layer 11. A material of the wiring layer 22 and a thickness of the wiring pattern of the wiring layer 22 may be configured in the same manner as the wiring layer 11, for example.

The solder resist layer 23 is an outermost layer of the other side of the wiring substrate 1, and is formed on the lower surface of the insulation layer 21 so as to cover the wiring layer 22. The solder resist layer 23 may be formed of a photosensitive resin such as an epoxy-based resin and an acryl-based resin, for example. A thickness of the solder resist layer 23 may be set to about 15 μm to 35 μm, for example.

The solder resist layer 23 has openings 23*x*, and portions of a lower surface of the wiring layer 22 are exposed to bottom portions of the openings 23*x*. A planar shape of the opening 23*x* may be circular, for example. If necessary, the lower surface of the wiring layer 22 exposed into the openings 23*x* may be formed with a metal layer or may be subjected to an antioxidant treatment such as an OSP (Organic Solderability Preservative) treatment. As the metal layer, an Au layer, a Ni/Au layer (a metal layer having a Ni layer and an Au stacked in corresponding order), a Ni/Pd/Au layer (a metal layer having a Ni layer, a Pd layer and an Au layer stacked in corresponding order), and the like may be exemplified. The lower surface of the wiring layer 22 exposed to the bottom portions of the openings 23x are formed with the external connection terminals 24 such as solder bumps.

In the meantime, if necessary, a predetermined number of insulation layers and wiring layers may be alternately stacked between the insulation layer 21 and the solder resist layer 23 for a multi-layered structure.

[Manufacturing Method of Wiring Substrate of Exemplary Embodiment]

Subsequently, a manufacturing method of the wiring substrate of the exemplary embodiment is described. FIGS. 2A to 4C exemplify manufacturing processes of the wiring substrate of the exemplary embodiment. In the meantime, an example of the process for manufacturing one wiring substrate is herein described. However, a plurality of parts becoming wiring substrates may be manufactured and divided into individual parts to make the respective wiring substrates.

Figure 2A:
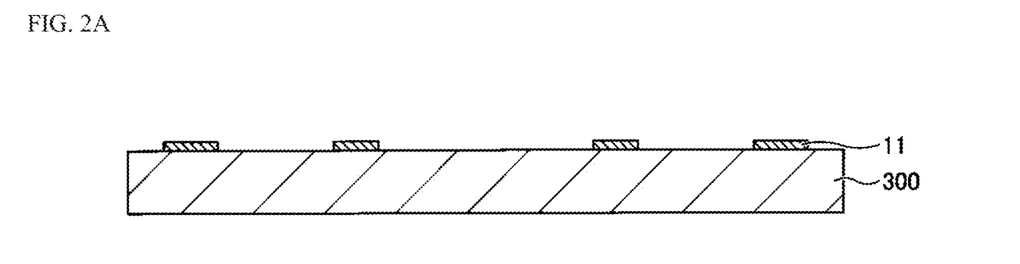
FIGS. 2A to 2D are views illustrating a manufacturing process of the wiring substrate in accordance with the exemplary embodiment (1 thereof).

First, in a process of FIG. 2A, a support body 300 of which an upper surface is a smooth surface is prepared. As the support body 300, a metal plate, a metal foil and the like may be used. In the exemplary embodiment, a copper foil is used as the support body 300. A thickness of the support body 300 may be set to about 18 μm to 100 μm, for example. Then, a wiring layer 11 is formed on the upper surface of the support body 300. In order to form the wiring layer 11, for example, a resist layer (for example, a dry film resist) having openings formed at portions, at which the wiring layer 11 is to be formed is formed on the upper surface of the support body 300, is formed. Then, the wiring layer 11 is formed on the upper surface of the support body 300 exposed into the openings of the resist layer by an electrolytic plating method in which the support body 300 is used as a power feeding layer, for example. Then, the resist layer is removed. The material and thickness of the wiring layer 11 are as described above.

Figure 2B:
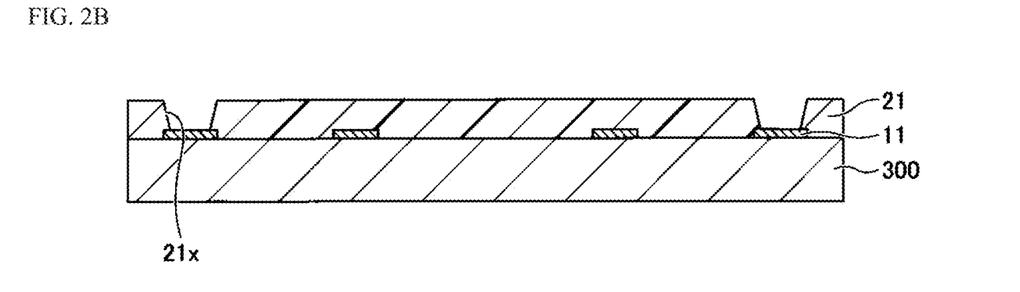

Subsequently, in a process of FIG. 2B, for example, a semi-cured film-shaped resin is laminated on the upper surface of the support body 300 so as to cover an upper surface and side surfaces of the wiring layer 11 and is then cured to form an insulation layer 21. Alternatively, instead of the laminating of the film-shaped resin, a liquid form or paste-like resin may be applied and cured to form the insulation layer 21. The material and thickness of the insulation layer 21 are as described above. Then, the insulation layer 21 is formed with via-holes 21x penetrating the insulation layer 21 and configured to expose the upper surface of the wiring layer 11. The via-holes 21x may be formed by a laser processing method of using $CO_2$ laser or the like, for example. After forming the via-holes 21x, a desmear treatment is preferably performed to remove the remaining resin attached to the surface of the wiring layer 11 exposed to bottom portions of the via-holes 21x.

Figure 2C:
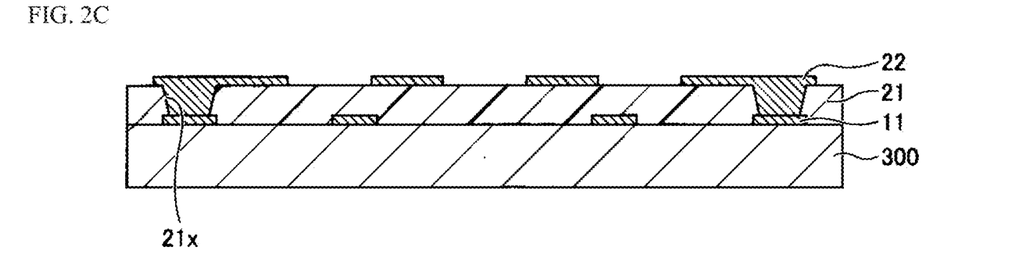

Subsequently, a wiring layer 22 is formed on one side of the insulation layer 21, in a process of FIG. 2C. The wiring layer 22 is formed to include via-wirings filled in the via-holes 21x and a wiring pattern formed on the upper surface of the insulation layer 21. The wiring layer 22 may be formed using a semi-additive method or a subtractive process, for example. The material of the wiring layer 22 and the thickness of the wiring pattern of the wiring layer 22 are as described above. The wiring layer 22 is electrically connected to the wiring layer 11 exposed to the bottom portions of the via-holes 21x.

For example, when forming the wiring layer 22 by the semi-additive method, a seed layer is formed on a surface of the insulation layer 21 including inner walls of the via-holes 21x and the upper surface of the wiring layer 11 exposed into the via-holes 21x by an electroless copper plating or the like. Subsequently, a resist layer having openings conforming to the shape of the wiring layer 22 is formed on the seed layer, and then an electrolytic plated layer is deposited on the seed layer exposed into the openings of the resist layer by an electrolytic plating method in which the seed layer is used as a power feeding layer. Then, the resist layer is removed, an etching is performing by using the electrolytic plated layer as a mask and the seed layer exposed from the electrolytic plated layer is removed, so that a wiring layer 14 can be obtained.

Subsequently, in a process of FIG. 2D, the support body 300 is removed. The support body 300 that is a copper foil can be removed by wet etching in which a hydrogen peroxide/sulfuric acid-based aqueous solution, a sodium persulfate aqueous solution, an ammonium persulfate aqueous solution or the like is used.

Figure 2D:
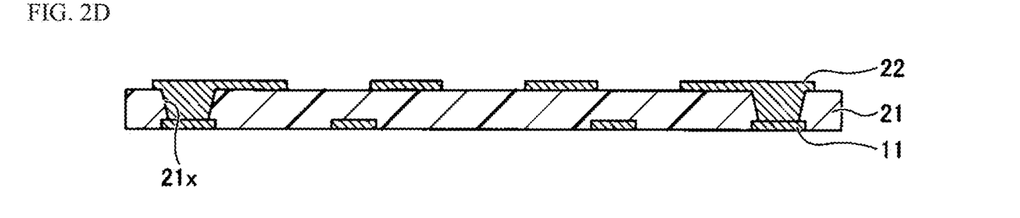
Figure 3A:
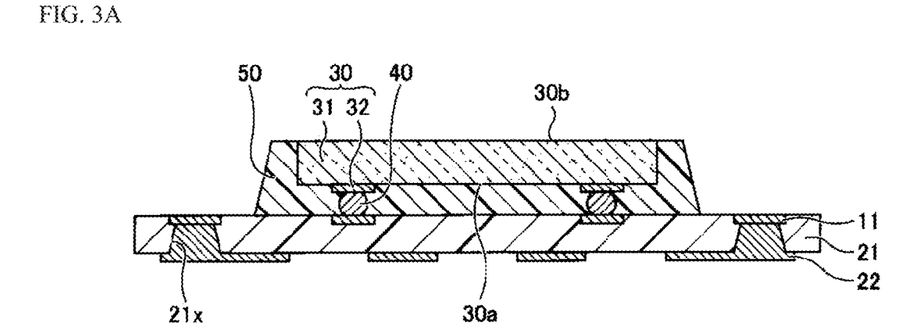
FIGS. 3A to 3D are views illustrating a manufacturing process of the wiring substrate in accordance with the exemplary embodiment (2 thereof).

Subsequently, in a process of FIG. 3A, the structure of FIG. 2D is vertically reversed, and a semiconductor chip 30 is flip chip-mounted on the insulation layer 21 in a state in which a circuit formation surface 30a faces toward the insulation layer 21 (a face down state). Specifically, the semiconductor chip 30 having electrode pads 32 formed on a semiconductor substrate 31 is arranged on the insulation layer 21 so that the electrode pads 32 face the pads for chip connection of the wiring layer 11 via bumps 40. Then, the bumps 40 are melted and solidified by reflow or the like, so that the pads for chip connection of the wiring layer 11 and the electrode pads 32 of the semiconductor chip 30 are bonded to each other via the bumps 40. Thereafter, an under-fill resin 50, which is filled between the circuit formation surface 30a of the semiconductor chip 30 and the upper surface of the insulation layer 21, covers the side surfaces of the semiconductor chip 30 and exposes a rear surface 30b, is formed.

Figure 3B:
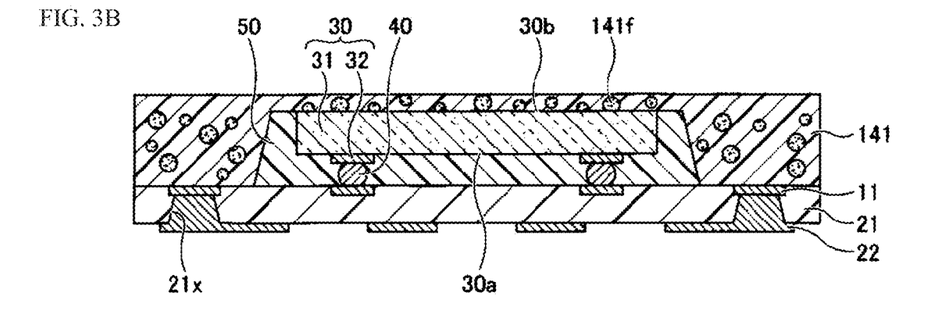

Subsequently, in processes of FIGS. 3B and 3C, an insulation layer 14 is formed on the upper surface of the insulation layer 21. First, as shown in FIG. 3B, the upper surface of the insulation layer 21 is formed with a first layer 141 that is to cover a part of the wiring layer 11, the rear surface 30b of the semiconductor chip 30 and the under-fill resin 50. Specifically, for example, a semi-cured film-shaped insulating resin including fillers 141f is prepared, and the insulating resin is laminated on the upper surface of the insulation layer 21, and is cured while heating and pressurizing the same, thereby forming the first layer 141. By pressurizing the film-shaped insulating resin with an appropriate pressure, at least one of the fillers 141f included in the first layer 141 is directly contacted to the rear surface 30b of the semiconductor chip 30 at one side, and the other side thereof is exposed from the upper surface of the first layer 141.

Figure 3C:
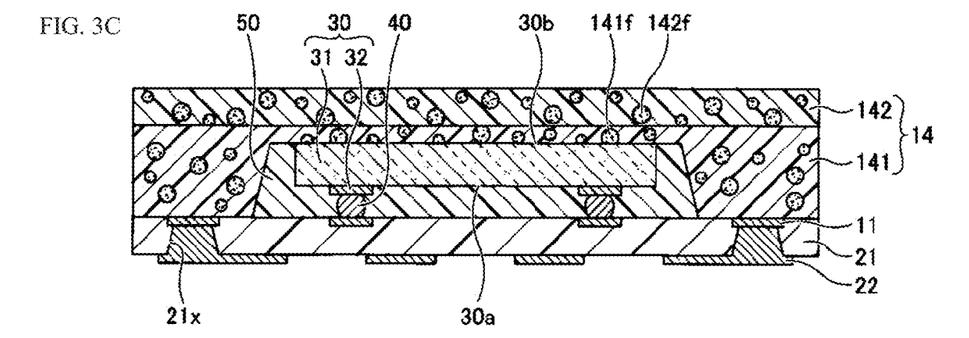

Then, as shown in FIG. 3C, an upper surface of the first layer 141 is formed with a second layer 142. Specifically, for example, a semi-cured film-shaped insulating resin including fillers 142f is prepared, and the insulating resin is laminated on the upper surface of the first layer 141, and is cured while heating and pressurizing the same, thereby forming the second layer 142. The other side of the filler 141f exposed from the upper surface of the first layer 141 is in direct contact with the second layer 142. That is, at least one of the fillers 141f included in the first layer 141 is in direct contact with the rear surface 30b of the semiconductor chip 30 at one side, and the other side is exposed from the upper surface of the first layer 141 and is thus in direct contact with the second layer 142. In the meantime, one or both of the first layer 141 and the second layer 142 may be manufactured by curing a liquid form or paste-like insulating resin, instead of the film-shaped insulating resin.

Figure 3D:
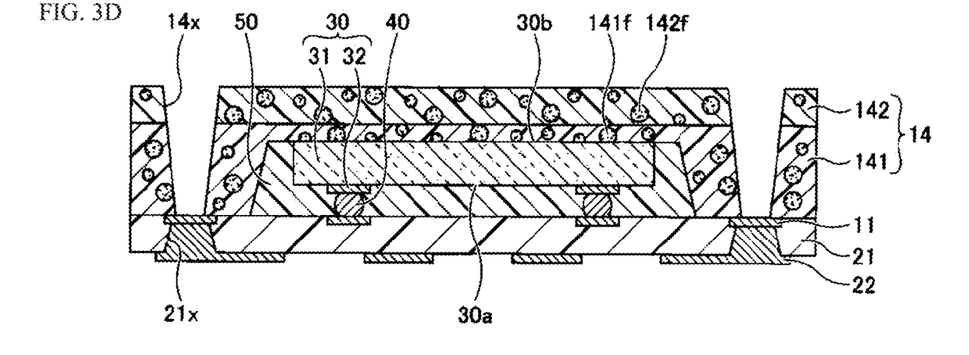

Subsequently, in a process of FIG. 3D, the insulation layer 14 is formed with via-holes 14x penetrating the insulation layer 14 (the first layer 141 and the second layer 142) and exposing the upper surface of the wiring layer 11. The via-holes 14x may be formed by a laser processing method of using $CO_2$ laser or the like, for example. After forming the via-holes 14x, a desmear treatment is preferably performed to remove the remaining resin attached to the surface of the wiring layer 11 exposed to bottom portions of the via-holes 14x.

Figure 4A:
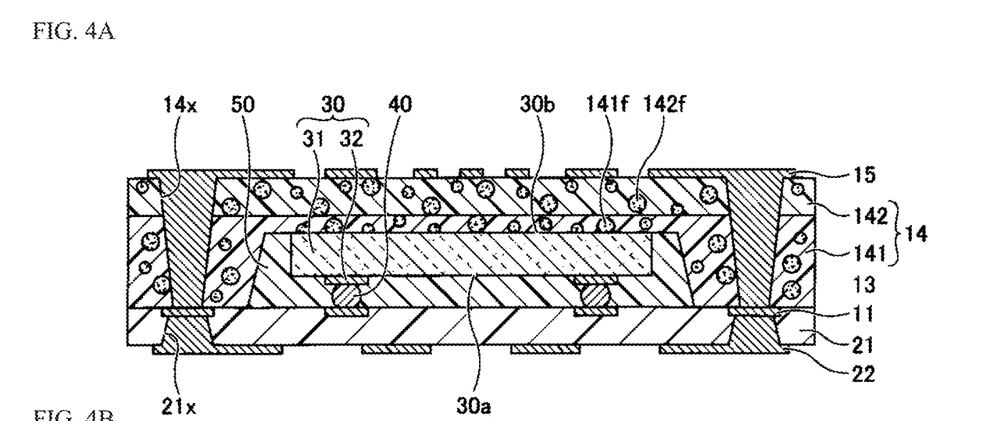
FIGS. 4A to 4C are views illustrating a manufacturing process of the wiring substrate in accordance with the exemplary embodiment (3 thereof).

Subsequently, in a process of FIG. 4A, a wiring layer 15 is formed on one side of the insulation layer 14. The wiring layer 15 is formed to include via-wirings filled in the via-holes 14x and the wiring pattern formed on the upper surface of the insulation layer 14. The wiring layer 15 may be formed using a semi-additive method or a subtractive process, for example. The material of the wiring layer 15 and the thickness of the wiring pattern of the wiring layer 15 are as described above. The wiring layer 15 is electrically connected to the wiring layer 11 exposed to the bottom portions of the via-holes 14x.

Figure 4B:
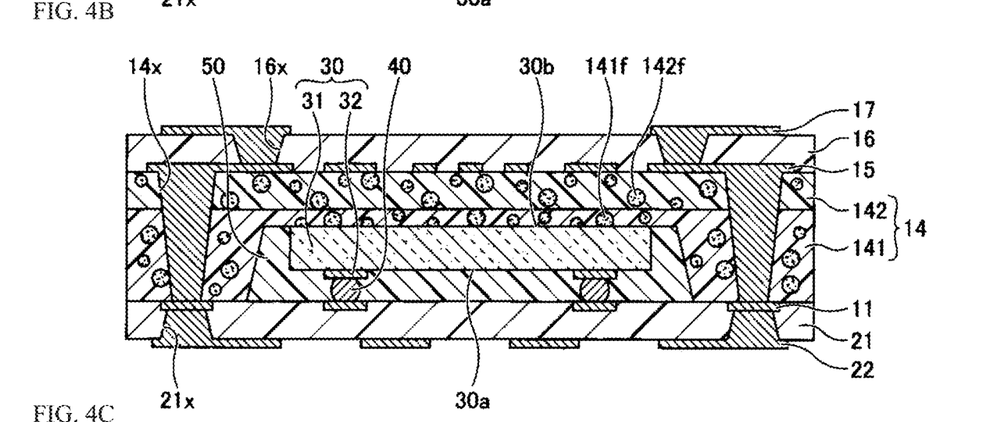

Subsequently, in a process of FIG. 4B, an insulation layer 16, via-holes 16x, and a wiring layer 17 are formed on one side of the insulation layer 14 by the same processes as FIGS. 2B and 2C.

Figure 4C:
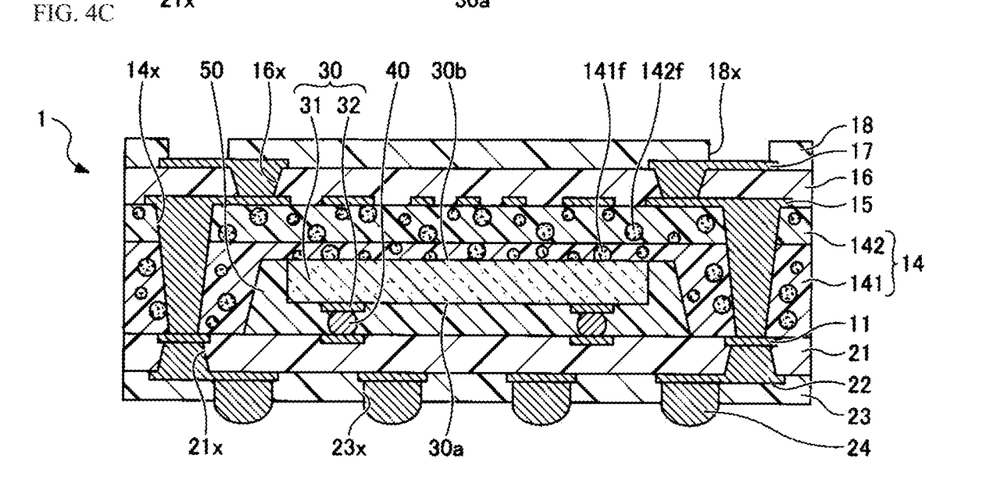

Subsequently, in a process of FIG. 4C, a solder resist layer 18 is formed on an upper surface of the insulation layer 16 so as to cover the wiring layer 17. Also, a solder resist layer 23 is formed on a lower surface of the insulation layer 21 so as to cover the wiring layer 22. The solder resist layer 18 may be formed by applying a liquid form or paste-like photosensitive epoxy-based insulating resin or acryl-based insulating resin to the upper surface of the insulation layer 16 so as to cover the wiring layer 17 by a screen printing method, a roll coat method, a spin coat method or the like. Alternatively, for example, the solder resist layer 18 may be formed by laminating a photosensitive epoxy-based insulating resin or acryl-based insulating resin having a film shape on the upper surface of the insulation layer 16 so as to cover the wiring layer 17. The formation method of the solder resist layer 23 is the same as the solder resist layer 18.

Subsequently, by exposing and developing the solder resist layers 18, 23, the solder resist layer 18 is formed with openings 18x configured to expose portions of the upper surface of the wiring layer 17 (photolithography method). Also, the solder resist layer 23 is formed with openings 23x configured to expose portions of the lower surface of the wiring layer 22 (photolithography method). In the meantime, the openings 18x, 23x may be formed by laser processing or blast processing, too. In this case, the photosensitive material may not be used for the solder resist layers 13, 23. A planar shape of each of the openings 18x, 23x may be circular, for example. A diameter of each of the openings 18x, 23x may be arbitrarily designed in conformity with a connection target (a semiconductor chip, a motherboard and the like).

Meanwhile, in the above process, the upper surface of the wiring layer 17 exposed to the bottom portions of the openings 18x and the lower surface of the wiring layer 22 exposed to the bottom portions of the openings 23x may be formed with the above-described metal layers by the electroless plating method or the like. Also, instead of forming the metal layers, an antioxidant treatment such as OSP treatment may be performed.

Subsequently, the lower surface of the wiring layer 22 exposed to the bottom portions of the openings 23x is formed with external connection terminals 24 such as solder bumps, so that a wiring substrate 1 is completed. The external connection terminals 24 may be formed at a necessary point of time, without forming the same in the process of FIG. 4C.

Figure 5:
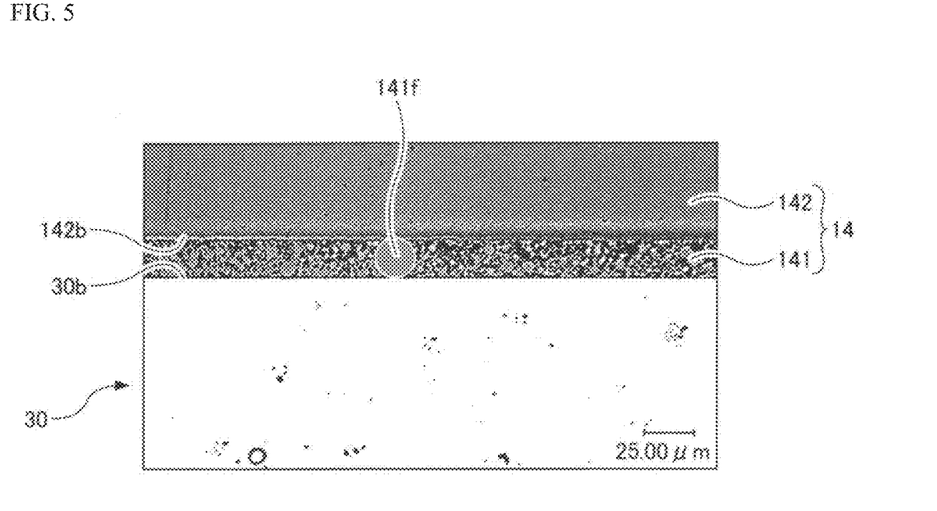
FIG. 5 is a view showing SEM photograph of the wiring substrate in accordance with the exemplary embodiment.

FIG. 5 is a view showing SEM (Scanning Electron Microscope) photograph of the wiring substrate in accordance with the exemplary embodiment, and shows an example in which the wiring substrate 1 having a structure of FIG. 1A was actually manufactured and a sectional SEM photograph was taken in the vicinity of the insulation layer 14. From FIG. 5, it can be seen that at least one of the fillers 141f included in the first layer 141 of the insulation layer 14 is in direct contact with the rear surface 30b of the semiconductor chip 30 at one side and the other side is exposed from the upper surface of the first layer 141 and is thus in direct contact with the lower surface 142b of the second layer 142.

In this way, in the wiring substrate 1, the insulation layer 14 has the two-layered structure in which the second layer 142 is stacked on the first layer 141 so as to smooth the upper surface of the insulation layer 14. In the structure, at least one of the fillers 141f included in the first layer 141 is in direct contact with the rear surface 30b of the semiconductor chip 30 and the second layer 142.

By the above structure, even in the case that the insulation layer 14 is formed to have the two-layered structure so as to smooth the upper surface of the insulation layer 14, it is possible to suppress the heat conductivity from being lowered due to an interface between the first layer 141 and the second layer 142 just above the semiconductor chip 30. That is, since the heat generated from the semiconductor chip 30 is transferred through the fillers 141f having the heat conductivity higher than the resin configuring the first layer 141, it is possible to effectively move the heat from the semiconductor chip 30 to the second layer 142, so that it is possible to improve the heat dissipation characteristic of the wiring substrate 1.

First Modified Example of Exemplary Embodiment

Figure 6:
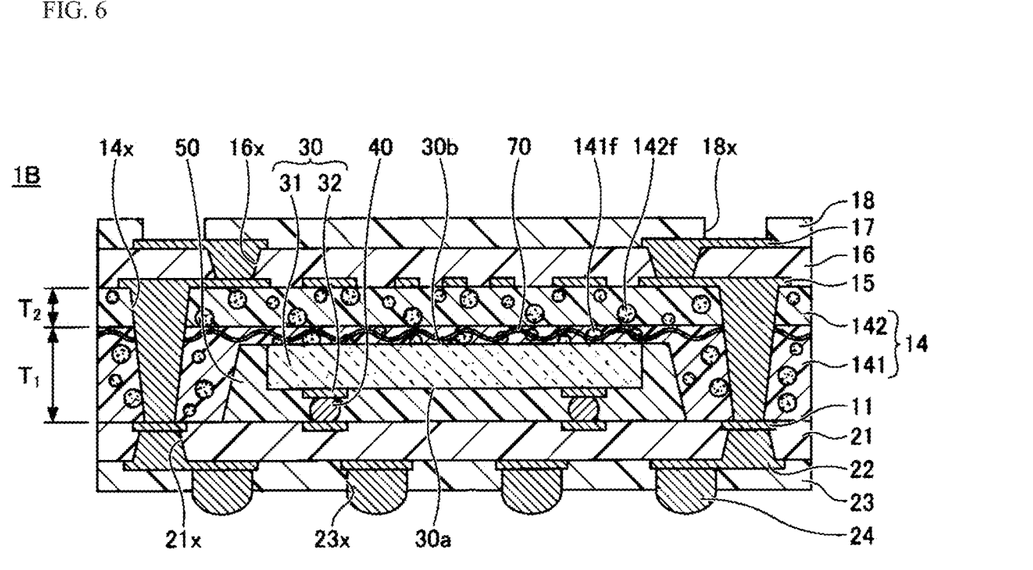
FIG. 6 is a sectional view illustrating a wiring substrate in accordance with a first modified example of the exemplary embodiment.

In a first modified example of the exemplary embodiment, an example in which a reinforcement member 70 is arranged in the first layer 141 is described. In the meantime, in the first modified example of the exemplary embodiment, the descriptions of the same constitutional components as the exemplary embodiment may be omitted.

FIG. 6 is a sectional view illustrating a wiring substrate in accordance with the first modified example of the exemplary embodiment. Referring to FIG. 6, a wiring substrate 1B is different from the wiring substrate 1 (refer to FIG. 1A), in that the reinforcement member 70 is arranged in a region of the first layer 141 located on the rear surface 30b of the semiconductor chip 30. The reinforcement member 70 is, for example, a glass cloth. As the reinforcement member 70, a member other than the glass cloth may be used inasmuch as it has holes, which will be described later.

In the case in which the reinforcement member 70 is the glass cloth, the glass cloth has such a shape that first glass fiber bundles aligned side by side with predetermined intervals in a predetermined direction and second glass fiber bundles aligned side by side with predetermined intervals in a direction substantially perpendicular to the predetermined direction are plain-woven in a lattice shape. Each of the first glass fiber bundle and the second glass fiber bundle is formed by bundling a plurality of glass fibers of several μm into a width of several 100 μm, for example. Holes (cavities or spaces) are formed between the first glass fiber bundles and the second glass fiber bundles intersecting with each other, and the resin configuring the first layer 141 is filled in the holes.

In the holes formed by the reinforcement member 70, at least one of the fillers 141f included in the first layer 141 is arranged. At least one of the fillers 141f arranged in the holes formed by the reinforcement member 70 is in direct contact with the rear surface 30b of the semiconductor chip 30 at one side, and the other side is exposed from the first layer 141 and is thus in direct contact with the second layer 142.

In this way, the reinforcement member 70 is arranged in the first layer 141, so that it is possible to further achieve following effects, in addition to the effects of the exemplary embodiment. That is, the reinforcement member 70 is arranged in the first layer 141, so that it is possible to easily transfer upwardly and laterally the heat generated from the rear surface 30b of the semiconductor chip 30. As a result, it is possible to further improve the heat dissipation characteristic of the wiring substrate 1B, as compared to the wiring substrate 1. A primer layer may be formed on the upper surface of the first layer 141 having the reinforcement member 70. Thereby, it is possible to further easily transfer laterally the heat generated from the rear surface 30b of the semiconductor chip 30.

Second Modified Example of Exemplary Embodiment

Figure 7:
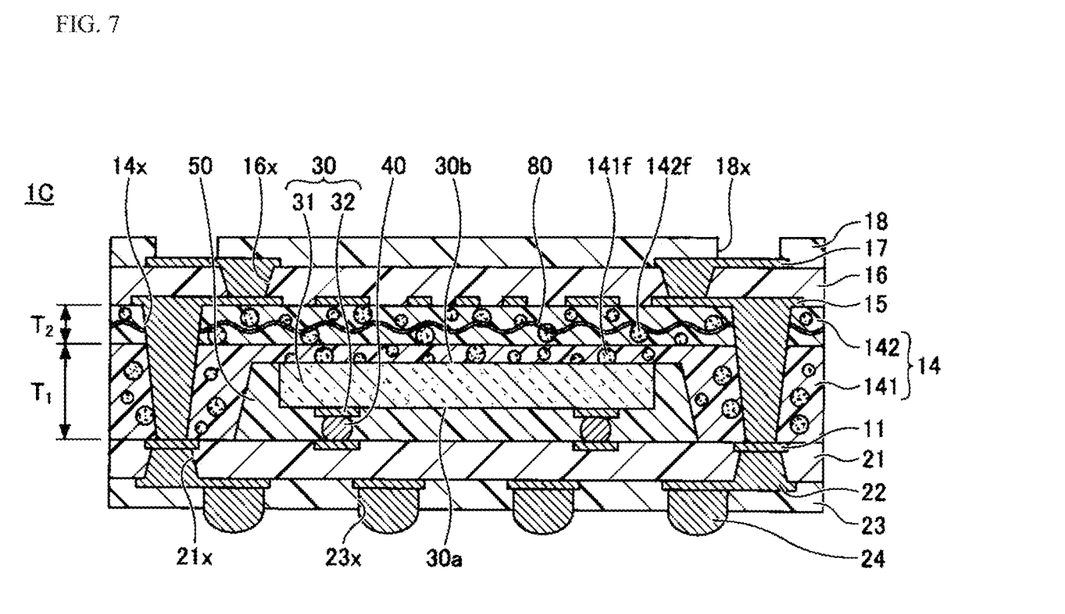
FIG. 7 is a sectional view illustrating a wiring substrate in accordance with a second modified example of the exemplary embodiment.

In a second modified example of the exemplary embodiment, an example in which a reinforcement member 80 is arranged in the second layer 142 is described. In the meantime, in the second modified example of the exemplary embodiment, the descriptions of the same constitutional components as the exemplary embodiment may be omitted.

FIG. 7 is a sectional view illustrating a wiring substrate in accordance with the second modified example of the exemplary embodiment. Referring to FIG. 7, a wiring substrate 1C is different from the wiring substrate 1 (refer to FIG. 1A), in that the reinforcement member 80 is arranged in the second layer 142. The reinforcement member 80 is, for example, a glass cloth. As the reinforcement member 80, a woven fabric or non-woven fabric of carbon fiber, aramid fiber or the like may also be used. In the meantime, the reinforcement member 80 may not have the holes.

In this way, the reinforcement member 80 is arranged in the second layer 142, so that it is possible to further achieve following effects, in addition to the effects of the exemplary embodiment. That is, the reinforcement member 80 is arranged in the second layer 142, so that it is possible to easily transfer upwardly and laterally the heat generated from the rear surface 30b of the semiconductor chip 30. As a result, it is possible to further improve the heat dissipation characteristic of the wiring substrate 1C, as compared to the wiring substrate 1. A primer layer may be formed on the upper surface of the second layer 142 having the reinforcement member 80. Thereby, it is possible to further easily transfer laterally the heat generated from the rear surface 30b of the semiconductor chip 30.

In the meantime, the second modified example of the exemplary embodiment can be combined with the first modified example of the exemplary embodiment.

Although the preferred embodiments have been described, the present disclosure is not limited to the above embodiments, and can be diversely modified and replaced without departing from the claims.

What is claimed is:

1. A wiring substrate comprising:
a first insulation layer;
an electronic component including a first surface and a second surface which is an opposite surface to the first surface, the electronic component being mounted on the first insulation layer with the first surface facing toward the first insulation layer; and
a second insulation layer including a first layer and a second layer,
wherein the first layer is formed on the first insulation layer and configured to cover the second surface of the electronic component, and the second layer is stacked on the first layer,
wherein the first layer is formed of a first insulating resin that includes therein fillers, and the second layer is formed of a second insulating resin that is different than the first insulating resin,
wherein at least one of the fillers is in direct contact with the second surface of the electronic component at one side, and is exposed from the first layer and is thus in direct contact with the second layer at the other side, and
wherein a heat conductivity of the second insulating resin forming the second layer is higher than a heat conductivity of the first insulating resin forming the first layer.

2. The wiring substrate according to claim 1, further comprising:
a first reinforcement member arranged in a region of the first layer located on the second surface of the electronic component,
wherein the first reinforcement member includes holes and the fillers are arranged in the holes, and
wherein said at least one of the fillers, which is in direct contact with the second surface of the electronic component at one side, and the other side thereof is exposed from the first layer and is thus in direct contact with the second layer, is arranged in one of the holes.

3. The wiring substrate according to claim 1, further comprising:
a second reinforcement member arranged in the second layer.

4. The wiring substrate according to claim 1, wherein as seen from above, in a region of the first layer located around the electronic component, a content of the fillers in a region closer to the second layer than a position of a half thickness of the first layer is larger than a content of the fillers in a region closer to the first insulation layer than the position of the half thickness of the first layer.

5. The wiring substrate according to claim 1, wherein a roughness degree of an upper surface of the second layer is smaller than a roughness degree of an upper surface of the first layer.

6. The wiring substrate according to claim 5, further comprising:
a wiring layer formed on the upper surface of the second layer,
wherein the wiring layer has a line/space equal to or smaller than 30 μm/30 μm.

7. The wiring substrate according to claim 1, wherein the electronic component is a semiconductor chip, the first surface is a circuit formation surface of the semiconductor chip and the second surface is a rear surface of the semiconductor chip, the semiconductor chip is mounted on the first insulation layer with the circuit formation surface facing toward the first insulation layer, and has the rear surface covered with the first layer.

8. The wiring substrate according to claim 1, wherein a thickness of a part, which covers the second surface of the electronic component, of the first layer is substantially the same as a maximum particle size of said at least one of the fillers.

* * * * *